United States Patent [19]
Greer et al.

[11] Patent Number: 5,345,201
[45] Date of Patent: Sep. 6, 1994

[54] SAW DEVICE AND METHOD OF MANUFACTURE

[75] Inventors: James A. Greer, Andover; Thomas E. Parker, Framingham, both of Mass.

[73] Assignee: Raytheon Company, Lexington, Mass.

[21] Appl. No.: 221,499

[22] Filed: Jun. 29, 1988

[51] Int. Cl.[5] .................. H03H 9/205; H01L 41/04
[52] U.S. Cl. ................... 333/193; 333/194; 333/195; 333/197; 310/313 R
[58] Field of Search .............. 333/193, 194, 195, 196, 333/197; 310/313

[56] References Cited

U.S. PATENT DOCUMENTS

| | | | |
|---|---|---|---|
| 4,213,104 | 7/1980 | Cullen et al. | 310/313 R |
| 4,295,102 | 10/1981 | Schmidt et al. | 310/313 R |
| 4,296,347 | 10/1981 | Weirauch | 310/313 R |
| 4,462,257 | 7/1984 | Gerhart et al. | 310/313 R |
| 4,639,697 | 1/1987 | Yarranton et al. | 310/313 R |

*Primary Examiner*—David C. Cain
*Attorney, Agent, or Firm*—Richard M. Sharkansky

[57] ABSTRACT

A low vibration sensitive SAW device includes a first quartz substrate having a pair of opposing surfaces, each surface which supports surface wave propagation. A pair of transducers are coupled to each of said surface wave propagation surfaces providing a pair of surface wave devices on opposing surfaces of the substrate. Each surface wave propagating surface is covered by a matching quartz cover and a glass-frit seal to provide a three piece all-quartz package. The pair of devices are connected together in parallel generally externally from the package, and when the dual device package undergoes vibration in a direction perpendicular to the surface wave propagation surfaces, one surface of the substrate will be subjected to a tensile strain field, whereas the opposite surface of the substrate will be subjected to identical but opposite direction strain field that is compressive. The pair of strain fields will induce equal but opposite shifts in resonant frequency of the device which will cancel each other out, providing a SAW device which is substantially invariant with vibration.

32 Claims, 10 Drawing Sheets

SAW DEVICE AND METHOD OF MANUFACTURE

BACKGROUND OF THE INVENTION

This invention relates generally to surface acoustic wave devices and more particularly to surface acoustic wave devices having reduced vibration sensitivity.

As is known in the art, surface acoustic wave devices (SAW Devices) such as resonators and delay lines are used a variety of applications. Generally, a SAW device includes a pair of transducers, each having a set of conductive members disposed on or recessed within a surface which supports surface wave propagation. Typically, the surface which supports surface wave propagation is comprised of a piezoelectric crystallographic material. In many applications for SAW devices, it is important to provide a package having a relatively small size which is properly mounted to reduce the so-called vibration sensitivity of the SAW device. Vibration sensitivity or microphonics refers to the frequency changes or noise resulting from mechanical stresses applied to the SAW device. Reduction in vibration sensitivity is particularly important when the SAW device is used to stabilize the frequency characteristic of an oscillator.

It is known that the resonant frequency of a SAW stabilized oscillator is sensitive to external vibration or changes external stresses applied to the SAW device. This sensitivity results from the external stresses on a piezoelectric causing changes in surface wave velocity characteristic of the device.

Generally, one of the more difficult problems encountered in using SAW devices is to reduce the effects of thermal expansion and proper mounting of the SAW device to reduce vibration sensitivity. It is known in the art to use RTV rubbers or natural rubbers between the SAW device and a mounting surface to accommodate differences in thermal expansion between the SAW device and the mounting surface. Artisans have also attempted to use RTV rubbers or natural rubbers reduce vibration sensitivity. When such soft stress damping material is uniformly attached to the bottom of the SAW device it was thought by the art that the stress damping material would act to damp out vibrations provided to the device.

Nevertheless, vibration sensitivity of SAW devices has limited their usefulness to low vibration environments for applications such as frequency stabilizing elements in high precision oscillators, because vibration sensitivity can substantially degrade the phase noise spectrum of a SAW oscillator when subjected to vibration. A reduction in SAW device vibration sensitivity by one order of magnitude, however, would reduce the corresponding contribution to phase noise by two orders of magnitude. A two order of magnitude improvement in phase noise levels would permit SAW devices to readily compete in electrical characteristics with bulk acoustic wave (SAW) devices in applications where the vibration environment is severe.

Airborne applications are one environment in which vibration sensitivity is a problem. In airborne applications, there are two types of acceleration which may be encountered. The first is a DC type of vibration resulting from acceleration of the device during flight of the airborne vehicle. DC vibration will cause a uni-directional deformation in the substrate of the SAW device during constant acceleration and a corresponding shift in the frequency characteristic of the device. The second is an AC type of vibration resulting from stresses, which vary in direction and magnitude. AC vibration will cause corresponding bi-directional deformation of the crystal and concomitant fluctuations in the frequency characteristics of the SAW device.

SUMMARY OF THE INVENTION

In accordance with the present invention, a surface acoustic wave device comprises means for providing a pair of mechanically coupled opposing surfaces, with each surface supporting surface wave propagation and a pair of SAW device disposed over respective ones of said pair of opposing surfaces, each device comprising input and output transducer means disposed over each of said mechanically coupled opposing surfaces for coupling to each one of said surface wave propagation surfaces. With this arrangement, by providing means having a pair of mechanically coupled, opposing surfaces which support surface wave propagation, and by providing input and output transducer means disposed over said surfaces, stresses having a normal incidence to the plane of the opposing surface wave propagation surfaces will cause a compressive strain on the surface of a first one of the surface wave propagation surfaces and an equal and opposite and hence, tensile strain on the second one of the surface wave propagation surfaces. That is, equal but opposite strains will be provided to each one of the devices causing concomitant equal and opposite changes in phase characteristics of the SAW devices. Therefore, if the SAW devices are connected in parallel at the input and output transducer means, the SAW device will have a substantially invariant frequency characteristic as a function of external stresses applied normal to the surface wave propagation surface.

In accordance with a further aspect of the present invention, a composite SAW device includes a base or substrate comprised of a piezoelectric crystalline material having a pair of opposing surfaces, with each one of said surfaces supporting surface wave propagation. Disposed on each one of said surfaces is a SAW device including a pair of spaced transducers coupled to a respective one of said surface wave propagation surfaces. Said transducers are substantially identical and disposed in substantial alignment with respect to a vertical plane normal to said surface wave propagation surfaces. First and second cover members each comprised of a matched piezoelectric crystalline material are disposed over said base to enclose each one of said surface wave propagation surfaces. A sealant material is disposed between each one of said covers and said base to provide a sealed enclosure for each of said surface wave devices. This particular arrangement, the crystallographic matched covers and sealant materials disposed over the crystallographic base provide hermetically sealed enclosures for the surface wave device, thereby enhancing long-term stability and short-term noise characteristics of each device. Furthermore, when the composite SAW device is subjected to vibration in a direction perpendicular to the plane of the composite device, one surface of the substrate will be subjected to a tensile strain field but because of the symmetry of the composite device, the other, opposite surface of the substrate will be subjected to a strain field having an identical magnitude but an opposite direction, that is a compressive strain field. Each strain field will induce an equal, but opposite shift in the frequency of each individual SAW device. These shifts will cancel each other if the devices are connected together, providing an output signal having a frequency characteristic which is substantially invariant with applied stress normal to the surface of the composite device.

In accordance with a further aspect of the present invention a method of reducing the vibration sensitivity of a SAW device is described. A pair of SAW devices such as resonators are disposed on opposing surfaces of a common substrate in strain coupling relationship. The resonators each include an input transducer and an output transducer. The input transducers of the first and second resonators are connected in parallel as with the output transducers of the first and second resonators. With this technique, in response to applied stress, equal but opposite strains are induced on the opposing surfaces of the substrate which provide concomitant shifts in resonant frequency of the SAW devices which are substantially equal in magnitude but opposite in phase. Accordingly, when connected together in parallel, the composite resonator frequency will be substantially invariant with external stress (i.e. vibration) applied normal to the surface wave propagation surface.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figure 1:
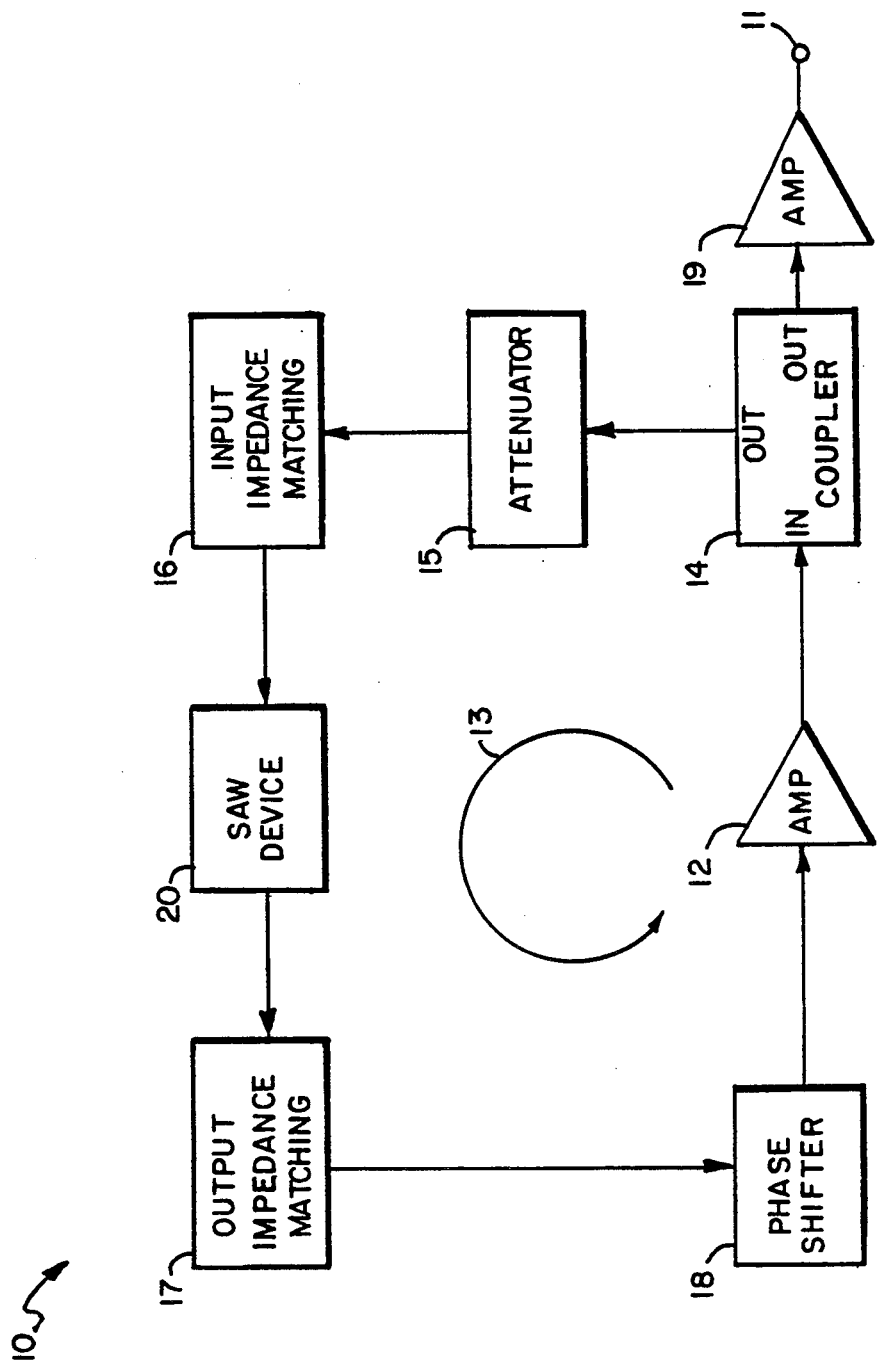
FIG. 1 is a block diagram showing a SAW device used as frequency stabilizing element in an oscillator circuit.

Referring now to FIG. 1, an oscillator circuit 10 is shown to include an amplifier 12 and feedback circuit denoted by an arrow 13 coupled between the input and output ports the amplifier 12. The feedback circuit 13 includes coupling means 14, attenuator 15, input impedance matching network 16, a SAW device 20, an output impedance matching network 17, and a phase shifter 18. The SAW device 20, here a resonator, although other SAW devices such as a delay lines, for example, may be used, is disposed in the feedback circuit 13 to stabilize the phase and frequency characteristics of the feedback signal in the feedback circuit 13. The frequency of the output signal fed to the input of amplifier 12 is provided accordance with the phase and frequency characteristics of the signal fed back to the input of amplifier 12, which are in turn principally determined and stabilized by the phase and frequency characteristics of the SAW device, as is well known in the art, to provide an oscillator output signal at terminal 11.

It is generally appreciated with high precision and stable oscillators having a SAW device as the frequency stabilizing element that the SAW devices frequency characteristics fluctuate with applied stress particularly stress applied normal to the surface wave propagation surface of the SAW device. This so-called vibration sensitivity of the SAW device is related to the flexing or bending of the surface wave propagation surfaces which modulates the surface wave velocity characteristic of the SAW device. This modulation causes a concomitant increase in FM phase noise of an oscillator employing a SAW device as a frequency stabilizing element. It is this limitation in particular which has made conventional SAW devices not generally suitable in applications in high vibration, airborne environments when frequency stability is required.

Figure 2A:
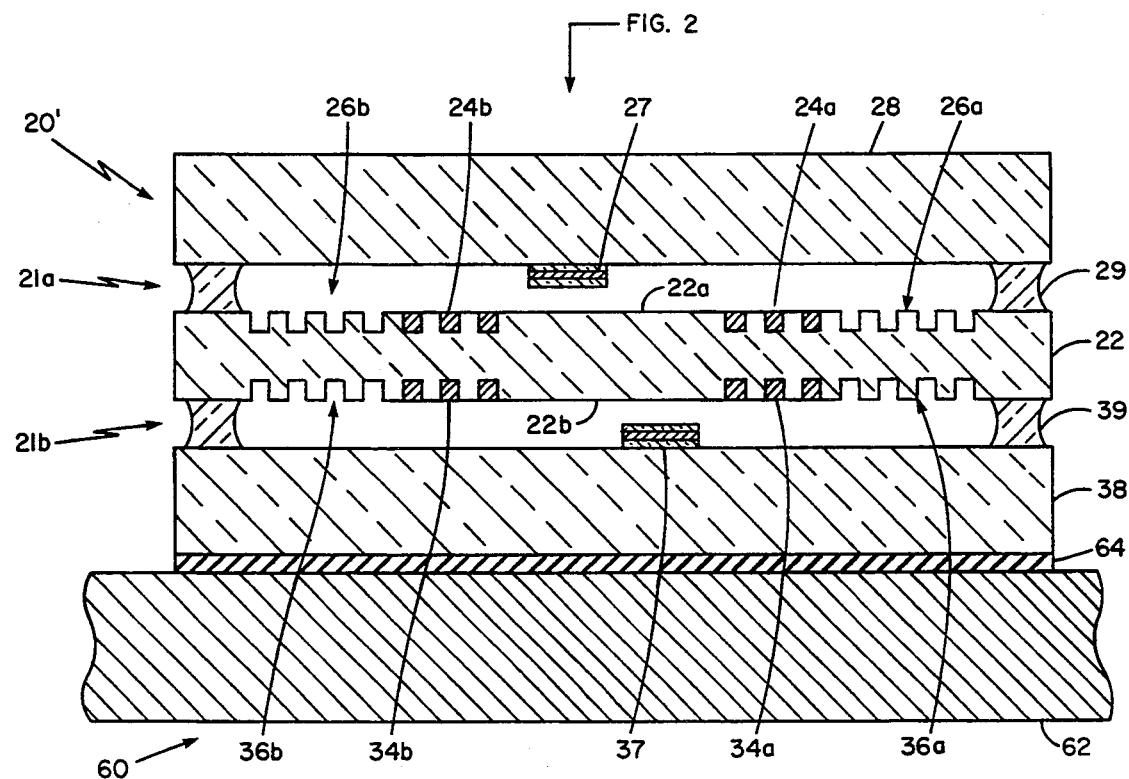
FIG. 2A is a cross-sectional view taken along lines 2a—2a of FIG. 2.
Figure 2:
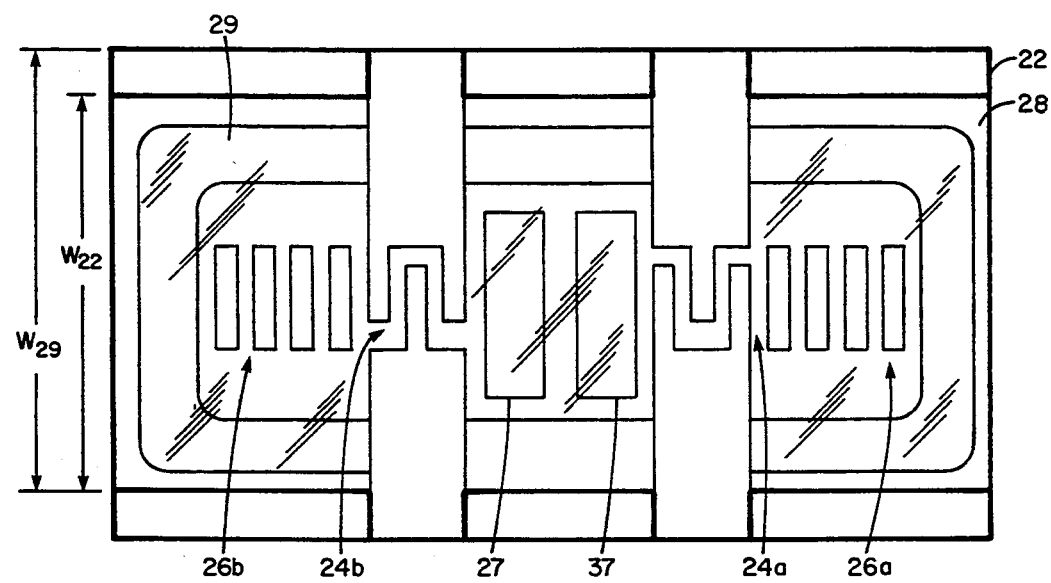
FIG. 2 is an isometric view of a vibration insensitive composite SAW resonator having a pair of SAW resonator devices disposed on a common substrate, with a pair of quartz covers disposed to seal the pair of SAW resonator devices.

Referring now to FIG. 2, a vibration insensitive SAW device resonator 20' useful for the stabilizing SAW element 20 in the oscillator 10 of FIG. 1 is shown to include a pair of SAW resonators 21a, 21b formed over opposite surfaces 22a, 22b of a common substrate 22 comprised of a piezoelectric acoustic material, here ST-cut or a rotated ST-cut of quartz, although other cuts of quartz, as well as materials such as lithium niobate and gallium arsenide may be used. Each one of the resonators 21a, 21b has a pair of interdigitated transducers 24a, 24b, and 34a, 34b disposed on respective surface wave propagation surfaces 22a, 22b. Each resonator also includes a pair of reflecting gratings 26a, 26b and 36a, 36b disposed in surfaces 22a, 22b respectively and disposed to confine surface wave propagation substantially between said pairs of transducers, as is generally known in the art for single resonator devices. Each one of the resonators 21a, 21b is enclosed by a respective cover 28 and 38, each cover having a trim pad 27, 37 disposed on an inner surface thereof, and a sealant material 29, 39, between each cover 28, 38 and the base 22 as shown.

By providing a pair of, preferable identical, resonators 21a, 21b on a common substrate 22, and preferably with said resonators 21a, 21b being disposed in substantial mutual alignment any vibration induced strain on one SAW resonator will produce an equal but opposite strain in the other resonator. If the devices are connected in parallel, that is if the input transducers 24a, 34b are connected as shown, and the output transducers 24b, 34b are connected, as shown, a positive frequency shift from one resonator will be compensated for by a negative frequency shift in the other resonator. This arrangement provides a composite SAW resonator 20' which has a frequency characteristic which is substantially invariant with bending stress applied normal to the surfaces 22a, 22b of the resonator 20'. Since, the most significant contribution vibration induces frequency variations is from forces applied normal to the surface wave propagation surfaces, the composite SAW resonator 20' shown in FIG. 2 will have a frequency characteristic which is substantially invariant with applied stress. Stress applied perpendicular to the surfaces 22a, 22b of substrate 22, will subject one of said surfaces 22a, 22b of substrate 22 to a tensile strain field. However, because the dual, composite resonator has a pair of resonator structures formed on opposing surfaces of a common base and disposed in substantial alignment, a strain field having an identical magnitude but opposite direction, that is a compressible strain field will be provided in response to the tensile strain field at the opposite surface 22a, 22b of the substrate 22. Each strain field will induce equal, but opposite shifts in the frequency characteristic of the respective individual SAW resonators 21a, 21b. These shifts will be substantially equal in magnitude and substantially 180° out of phase, thus cancelling each other if the first and second resonator devices are connected in parallel as shown.

For optimum cancellation, it is generally preferred that the initial frequency of each device be substantially equal, preferably within +10 ppm and that the insertion loss of each device should also be substantially equal, preferably within +0.25 db.

Construction of a preferred embodiment of a dual resonator device having substantially reduced vibration sensitivity will now be described in conjunction with FIGS. 3A to 5C.

Figure 3A:
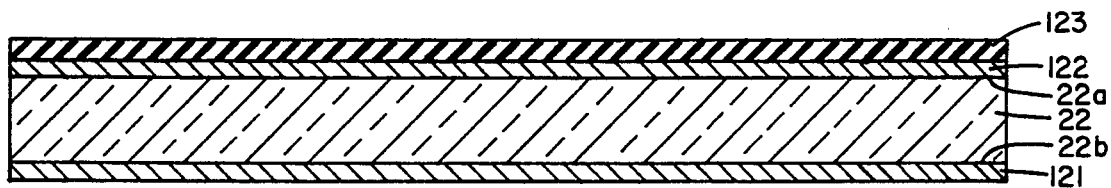
FIGS. 3A–3F are a series of cross-sectional views showing the steps in fabricating a first SAW resonator having recessed transducers and reflecting gratings, on a first surface of a piezoelectric base.

Referring first to FIG. 3A, the substrate 22 or a base here comprised of a single slab of piezoelectric material, although a pair of mechanically coupled slabs of material having a pair of surfaces disposed in strain transfer relationship which permit strain in one surface to be transmitted to the opposite surface may alternatively be used, has a pair of opposing polished surfaces 22a, 22b prepared to support surface wave propagation. Over each of the surfaces 22a, 22b will be disposed a SAW resonator.

Initially, over a first one of those surfaces here surface 22b is disposed a layer 121 of a protecting material such as vanadium or other protecting materials such as polyimide or silicon nitride. The purpose of layer 121 is to protect the surface 22b from scratches during processing of the other surface 22a and to protect surface 22b from chemical attach by agents used in the processing of the other surface 22a. Still referring to FIG. 3A, a protective layer 122 here of vanadium is provided over surface 22a of substrate 22 and is used to protect the surface wave propagation surface 22a and to provide an adherent material for a layer of photoresist 123, as shown. In addition to providing adhesion and protection for the vandanium layer 122 is also deposited to facilitate a subsequent lift off of the photoresist layer 123. The vanadium layers each have a thickness of approximately 1000A and are each deposited in a vacuum by well-known techniques such as e-beam evaporation.

Figure 3B:
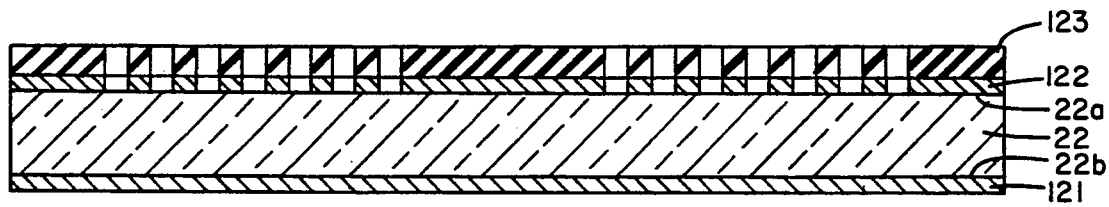

Referring now to FIG. 3B, the photoresist layer 123 is exposed to light, via a mask (not shown), and the exposed photoresist material is developed and washed away with a developer as is also well known in the art. The removal of the photoresist, exposes selected underlying portions of the vanadium layer 122 providing the desired electrode pattern for the transducers 24a, 24b (FIGS. 2A, 2B) and also the desired pattern for the reflecting gratings 26a, 26b (FIGS. 2A, 2B) for resonator 21a. The exposed portions of the vanadium layer 122 are removed in these regions by a plasma etch in which a reactive gas such as a mixture of carbon tetrafluoride and oxygen is applied to the vanadium layer under very low vacuum pressures. The gas becomes reactive by means of an electrical discharge within the vacuum chamber causing the gas to give off free radicals which attack the exposed vanadium layer 122 but which do not attack the photoresist. This provides a masking pattern which may be used to etch the substrate 22 to provide recessed transducer patterns and recessed reflecting grating patterns.

Figure 3C:
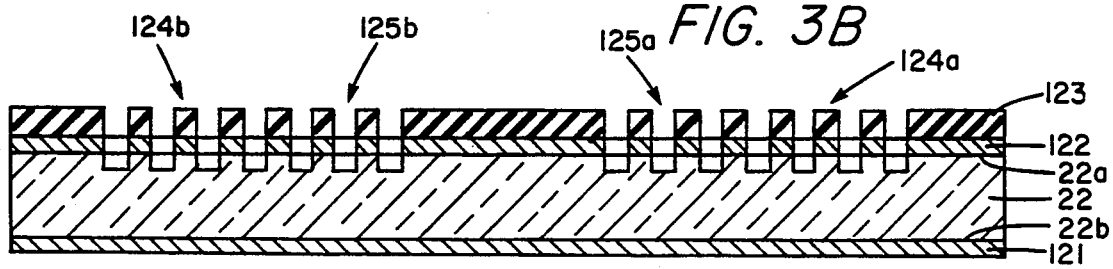

As shown in FIG. 3C, the substrate 22 is etched to a depth here 1,000 A by ion beam milling. Activated argon ions are used to etch the quartz substrate by physically eroding the quartz to form recessed patterns 124a, 124b for reflecting gratings 26a, 26b (FIG. 2) and recessed patterns 125a, 125b for transducers 24a, 24b (FIG. 2).

Figure 3D:
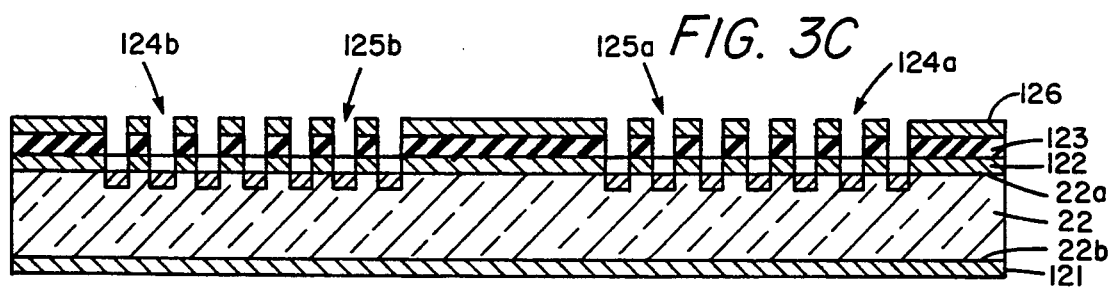

Referring now to FIG. 3D, a layer of metal 136, here copper doped aluminum approximate composition 0.5% Cu/99.5% Al is deposited onto the exposed portions of quartz substrate 22 and photoresist layer 123 using a similar process as that described for the deposition of vanadium. Thus, the Cu-doped aluminum is deposited within the grooves 125a and 125b disposed in the substrate 22. The Cu-doped aluminum deposited in grooves 125a, 125b provides the desired configuration for electrode fingers and pads (see FIGS. 2A, 2B) for the transducers 24a, 24b recessed within the surface of the quartz base 22. The Cu-doped aluminum which is deposited in the grooves 124a, 124b of the reflecting gratings is here removed by a subsequent masking and etching (not shown), as is generally known.

Figure 3E:
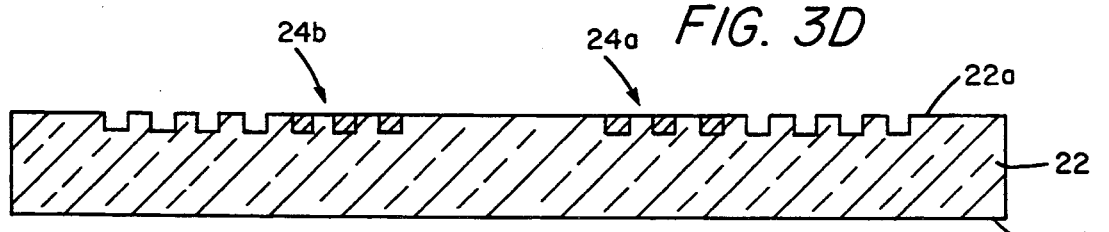

Referring now to FIG. 3E, subsequent to depositing Cu-doped aluminum to provide the transducers 24a, 24b, the photoresist layer 123 is removed such as by desolving in a suitable solvent for the photoresist type and, the aforementioned plasma etching technique is applied to remove the vanadium layers 121 and 122. The plasma etching using carbon tetrafluoride and oxygen is effectual in removing the vanadium but does not attack the Cu-doped aluminum recessed within the surface of the quartz base 22 or the quartz itself. Each surface may then be cleaned with a suitable cleaning agent such as carbon tetrafluoromethane.

Figure 3F:
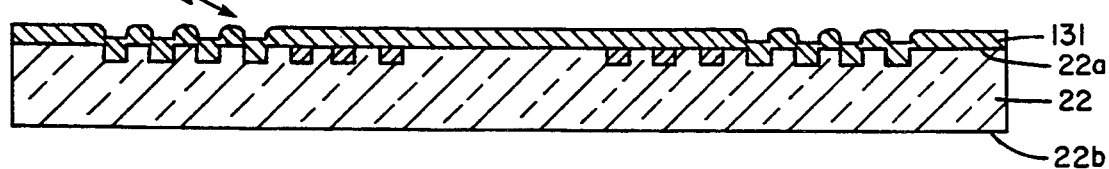

As shown in FIG. 3F, the surface 22a and the first SAW resonator 21a disposed thereon is protected by depositing a layer 131 of vanadium over the surface, as described for surface 22b in FIG. 3A.

Referring now to FIGS. 4A–4E, the second SAW resonator 21b is fabricated over the second surface 22b of substrate 22 in a similar manner as described above in conjunction with FIGS. 3A–3E.

Figure 4A:
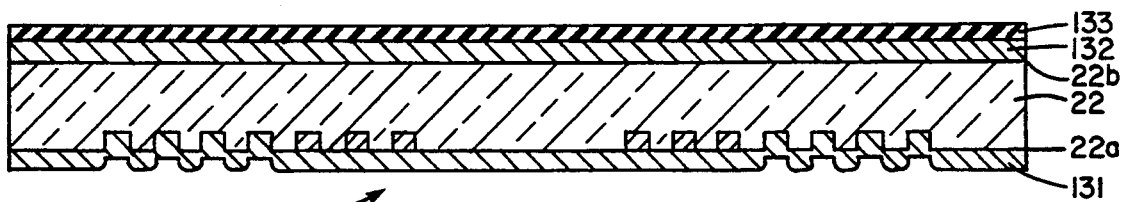
FIGS. 4A–4E are a series of cross-sectional views showing the steps in fabricating a second SAW resonator having recessed transducers and reflecting gratings on a second surface of the piezoelectric base as shown in FIG. 3F.

Referring particularly to FIG. 4A, the substrate 22 having disposed on surface 22a thereof SAW resonator 21a and the protective vanadium layer 131 is provided with a protective layer 132 here also of vanadium (although polimide and silicon nitrite may also be used) over surface 22b, as shown. Disposed over vanadium layer 132 is a photoresist layer 133.

Figure 4B:
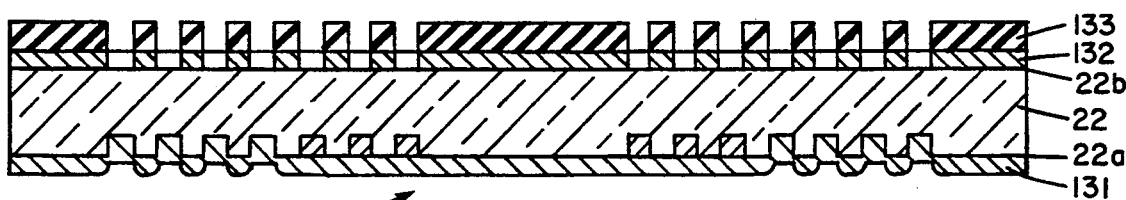

Referring now to FIG. 4B, the photoresist layer 133 is exposed via the same mask as used to fabricate the SAW resonator 21a, as described in conjunction with FIG. 3B (not shown). For optimum performance, it is preferred to align the mask (not shown) so that the pattern provided over surface 22b will be in substantial alignment with corresponding pattern over surface 22a which formed the resonator 21a. This alignment may be accomplished by any one of a number of alignment techniques. For example, the edges of the substrate 22 and alignment marks (not shown) disposed on the mask (not shown) may be used to insure that the devices are always fabricated in the same central portion of the substrate 22 in alignment with one another. The exposed portions of the photoresist layer 133 are then developed and washed away in regions which were not masked by the mask as is also well known in the art. The removal of the photoresist exposes underlying portions of the vanadium layer 132 and provides the desired transducer patterns and reflector grating patterns, as shown. The exposed portions of the vanadium layer 132 are removed in these regions by the plasma etching technique using a mixture of carbon tetrafluoride and oxygen, as described above.

Figure 4C:
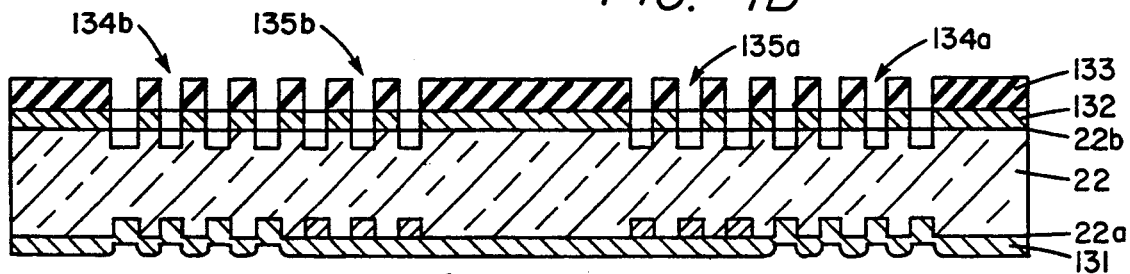

Referring now to FIG. 4C, the pattern provided in the photoresist layer 133 and vanadium layer 132 is used as a mask to etch the quartz and provide recesses 134a, 134b, and 135, 135b for reflecting gratings and transducers, as generally described in conjunction with FIG. 3C.

Figure 4D:
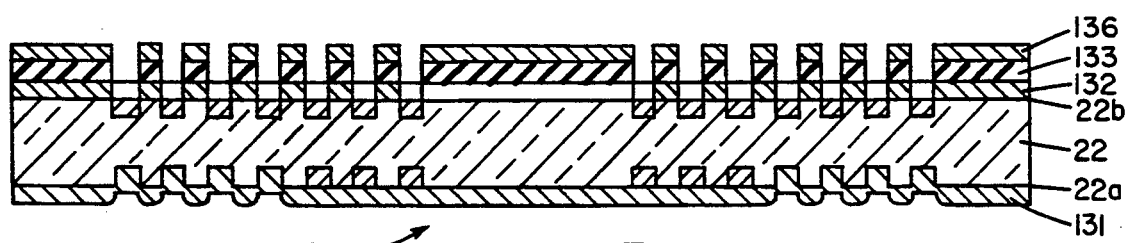

As shown in FIG. 4D, a layer 135 of metal here the Cu-doped aluminum is deposited in the recesses provided in quartz substrate 22 as was generally described in conjunction with FIG. 3D.

Figure 4E:
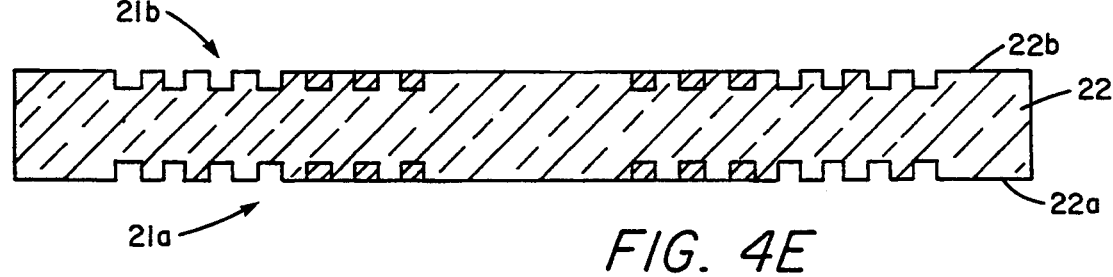

As shown in FIG. 4E, the Cu-doped aluminum which was deposited in the grooves 134a, 134b corresponding to the reflector gratings 36a, 36b is here removed by a subsequent masking and etching process as is generally known, and the photoresist layer 133 and the vanadium layers 132 and 131 are removed from the device as was generally described in conjunction with FIG. 3E above. Remaining on base or substrate 22 are the first SAW resonator 21a disposed on surface 22a thereof, and the second SAW resonator 21b disposed on the second surface 22b.

At this juncture, covers may be disposed to enclose each one of the SAW devices 21a, 21b. Preferably, the covers are a substrate of piezoelectric crystal material which is crystallographically matched to the piezoelectric crystalline material of the base. A preferred technique to seal the covers to the base is described below.

Figure 5A:
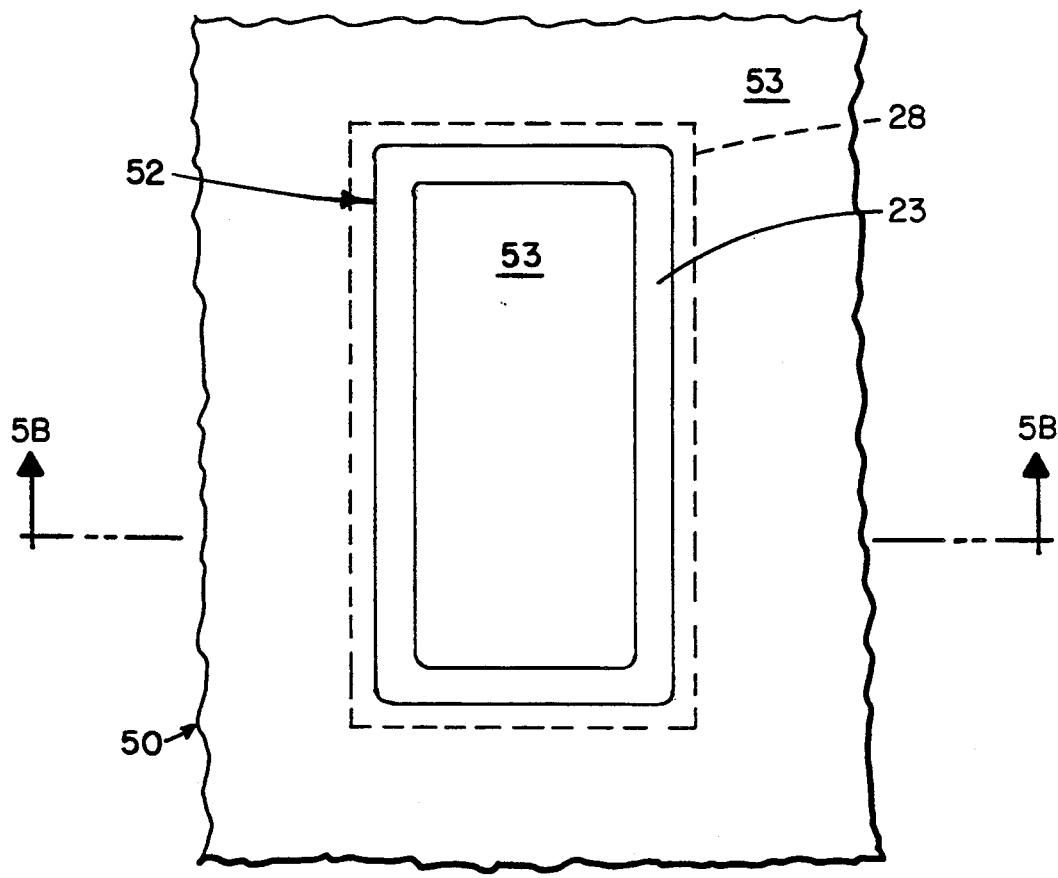
FIG. 5A is a plan view of a cover portion for a package for the SAW devices of FIG. 2 having on a first surface thereof a patterned glass frit sealant material.
Figure 5B:
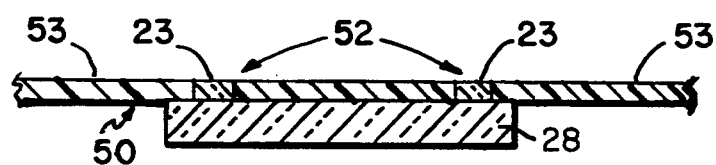
FIG. 5B is a cross-sectional view of the cover shown in FIG. 5A, taken along lines 5B—5B of FIG. 5A.

Fabrication of package 20' for the dual SAW resonator 20' (FIGS. 2A, 2B) will now be described in conjunction with FIGS. 5A–8B. FIG. 6 shows a typical flow chart of the processing steps used to fabricate covers for the resonator 20'.

Figure 5C:
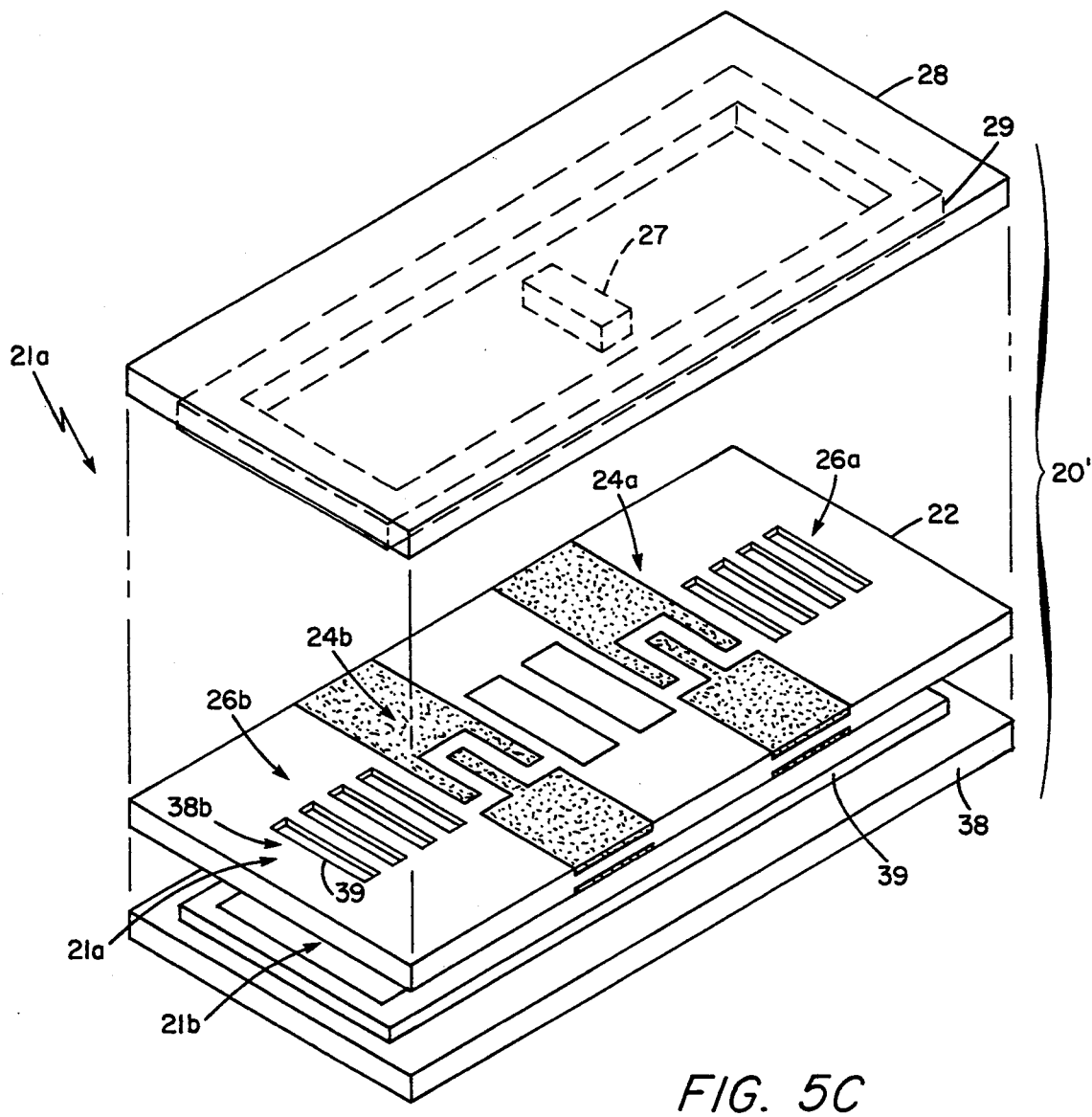
FIG. 5C is an exploded isometric view of a composite SAW resonator having a base with a pair of devices disposed over opposite surfaces thereof and a pair of covers disposed to enclose the pair of SAW devices.
Figure 6:
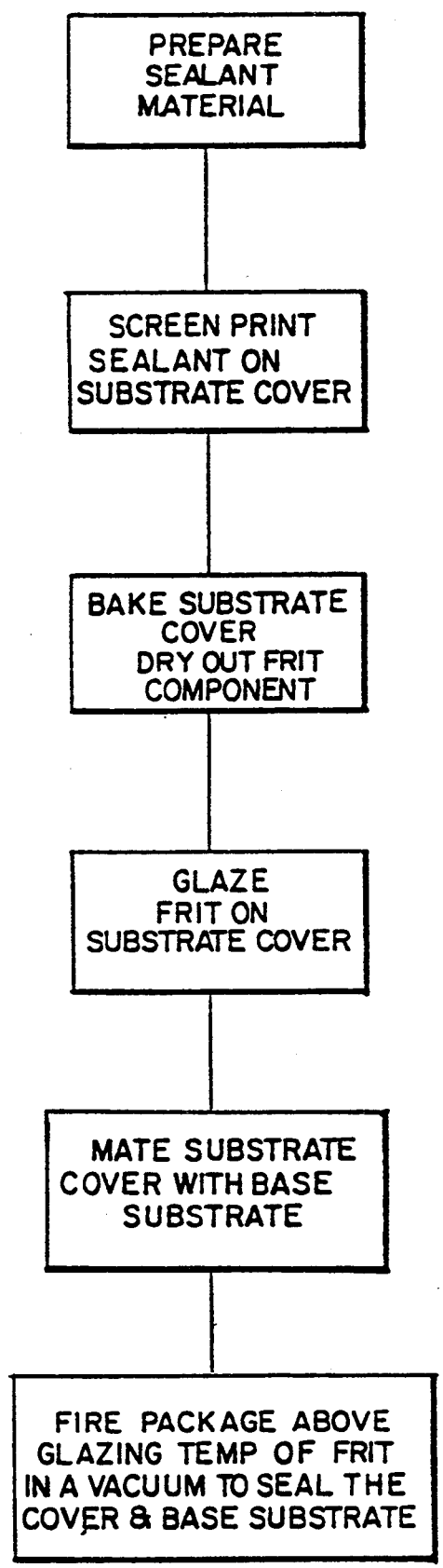
FIG. 6 is a flow chart showing the preferred steps in providing the quartz covers sealed to the quartz base in accordance with a preferred embodiment of the invention.

Referring first to FIG. 5C, the SAW resonators 21a, 21b are shown to include substrate covers 28, 38, base substrate 22 and glass frit seals 29, 39 disposed therebetween. Fabrication of cover 28 to base 22 by use of seal 29 for resonator 21a will be described. It is to be understood that similar processing steps would be used to fabricate cover 38 to base 22. Cover 38 may be fabricated concurrently with cover 28 or after cover 28.

Referring now to FIGS. 5A, 5B, a substrate cover 28, here comprised of ST-cut quartz, is shown to include a screen printed pattern 52 having disposed therein a sealant material 23, here said sealant material 23 being comprised of a mixture of a glass frit powder and an organic binder vehicle. Said screen printed pattern 52 and sealant material 23 are provided in a manner to be described.

Here the glass frit used is a high lead oxide content glass frit. Examples of two of such frits suitable for use with ST-cut quartz are Corning Glass Works, Corning, N.Y., No. 8463 vitrifying frit, and Corning No. 7572 devitrifying frit, hereinafter referred to as "8463" and "7572," respectively. However, any suitable glass frit having a thermal expansion coefficient substantially matched to the thermal expansion coefficient of the selected material of the substrate cover and base member and having a firing temperature below the crystallographic transformation temperature of the material of the substrate may also be used. The organic binder vehicle here used is a mixture of 60 ml butyl carbitol acetate, 40 ml butyl carbitol and 3 g of an acrylic resin, more particularly, an isobutyl methyl methacrylate resin, here obtained from Dupont Company, Special Products Division, Methyl Methacrylate Products Group, Wilmington, Del. under the tradename Elvacite "2045." Amyl acetate alone was tried as an organic binder vehicle. However, amyl acetate dried too quickly and the results were less acceptable. Thus, it was found that the best results were obtained using a binder vehicle which dried relatively slowly allowing sufficient time for the glass frit material to flow prior to the organic vehicle being driven off.

As was previously mentioned above, the sealant material 23 is screen printed onto here the substrate cover 28 of the package 20' (FIG. 3A). The sealant material 23 is screen printed as follows: A fine mesh stainless steel screen 50 is provided with an emulsion film layer 53 in a conventional manner. The pattern 52, here in the form of a rectangular ring pattern, is projected on the emulsion film 50. The area of the ring pattern 52 is exposed while the remaining portion of the layer 53 is unexposed. The exposed portion of layer 53 is developed and then dissolved away while the unexposed portion of layer 53 remains in situ on the screen 50, thus providing the patterned area 52. The patterned screen 50 is then disposed over the substrate cover 28. The sealant material 23 is then provided over the screen 50 and fills the pattern 52. Excess amounts of the sealant material on the screen 50 are removed by any suitable means, such as by use of a "squeegee." Remaining on the substrate 28 in the patterned area 52, however, is the sealant material 23. Preferably, the pattern 52 is provided over a peripheral surface portion of the substrate cover 28 adjacent to the edges of said substrate cover 28, as shown in FIGS. 5A and 5B. The sealant material 23 provides a continuous closed path or ring pattern on the surface of substrate cover 28. The sealant material 23 on the substrate cover 28 is processed in a manner to be described, to provide a glass frit seal 29 between the substrate cover 28 and a base member 22. Similarly, cover 38 is provided over base 22 with seal 39 in a corresponding manner to provide the dual resonator as shown in FIG. 5C.

Returning to fabrication of cover 28, after the sealant material 23 has been deposited in the unpatterned areas of the fine mesh screen 50, the fine mesh screen 50 is removed from the surface of the substrate cover 28. The substrate cover 28 having thereon the patterned sealant material is then baked in an oven at a temperature substantially below the glazing temperature of the glass frit. Here a temperature of 140° C. is used, said temperature being selected to dry out the sealant material, that is, to drive off from the sealant, the organic binder vehicle component thereof, without glazing the glass frit component. Here the substrate cover 26 is baked at 140° C. in air for approximately 1 hour.

Figure 7A:
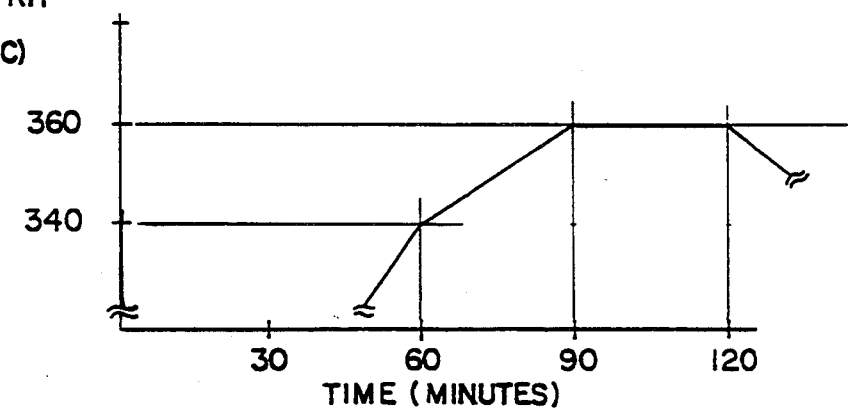
FIGS. 7A–7B are plots of temperature versus time for a heating cycle to glaze and seal the resonator with a devitrifying glass frit.
Figure 8A:
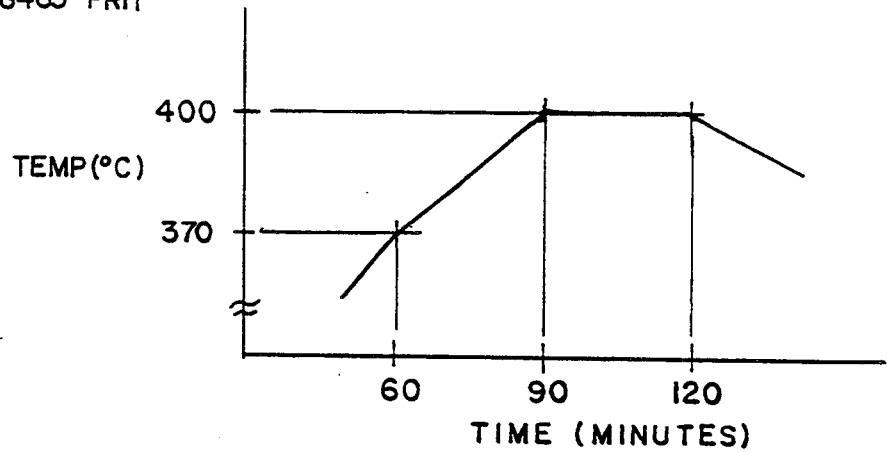
FIGS. 8A–8B are graphs of temperature versus time for a heating cycle to glaze and seal the resonator with a vitrifying glass frit.
Figure 8B:
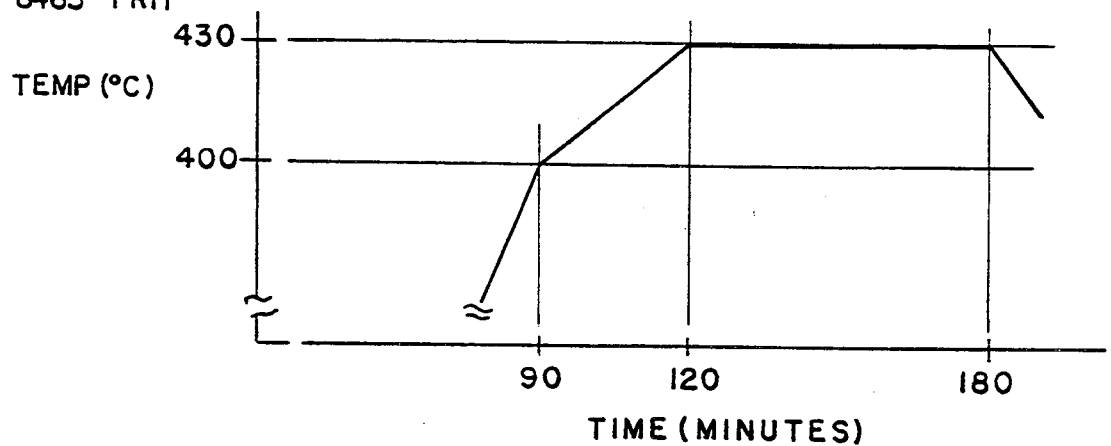

After the sealant material on the substrate cover 28 is dried, it is then heated in air within a chamber (not shown) at a temperature just above the softening point of the glass frit. This second heating cycle is used to "glaze" the glass frit on the substrate cover. That is, the glass frit powder is allowed to soften enough to cause the glass frit particles to flow together and to adhere to the substrate cover 28. Further, during this step, any additional remaining organic binder components in the glass frit are driven off. By providing the separate drying and glazing steps, it is believed that substantially all, if not all, of the binder vehicle components of the sealant material are driven off prior to final sealing of the cover 28 to the base 22. A glazing temperature profile such as shown in FIG. 7A for the devitrifying frit "7572" or a glazing temperature profile such as shown in FIG. 8A for the vitrifying frit "8463" is preferably used. For the vitrifying frit "8463", the general range for the glazing temperature is 380° C. to 435° C. The preferred temperature of 400° C. reduces the amount of bubbling and spread of the glass frit during the subsequent sealing operation. Similarly, for the devitrifying frit "7572" the temperature range for the glazing operation is from 340° C. 380° C. At the preferred temperature of 360°, the amount of bubbling of the glass frit material is reduced and the spread of the glass frit material is also reduced during the subsequent sealing operation. During the glazing operation, after the cover 28 has been held at the final temperature for the prescribed period of time, the heat source for the chamber is turned off and the cover 28 is allowed to cool to substantially room temperature before being removed from the chamber.

Referring now to FIG. 5C, a packaged SAW resonator 20' is shown. The package for such a device and for similar types of SAW devices such as a delay line, filter, and the like are substantially the same except for the particular configuration of transducers and reflecting gratings as required. Therefore, fabrication of the package 20' for the resonator 21a (FIG. 3A) will here be described, however, such fabrication procedure will equally apply to fabricating other types of packaged SAW devices. The SAW device package 20' for the resonator 21a is shown to include in addition to the processed substrate cover 26 as described in conjunction with FIGS. 5A, 5B, the base substrate 22, here comprised of ST-cut quartz having a thickness here substantially equal to the thickness of the substrate cover 26, and having on a surface 22a a pair of transducers 24a, 24b and over surface 22b, transducers 34a, 34b. Each one of said transducers 34, 36 are comprised of interdigitated conductive members, which are coupled to corresponding ones of bus bar members (not numbered), as shown. Bus bar members and interdigitated conductive members are fabricated as described above.

The substrate cover 28 having the glazed glass frit is mated to the substrate surface 22a to provide a seal 29 as shown in FIGS. 2A, 2B, and 5C. The glass frit seal 29 in addition to providing a hermetic seal for the packaged SAW device also serves the purpose of a spacer to provide a space 29a (FIG. 5) between the opposing inner surfaces of the pair of substrates 22, 26. This space 29a permits the uninhibited propagation of surface waves along the surface 22a of base substrate 22.

Figure 7B:
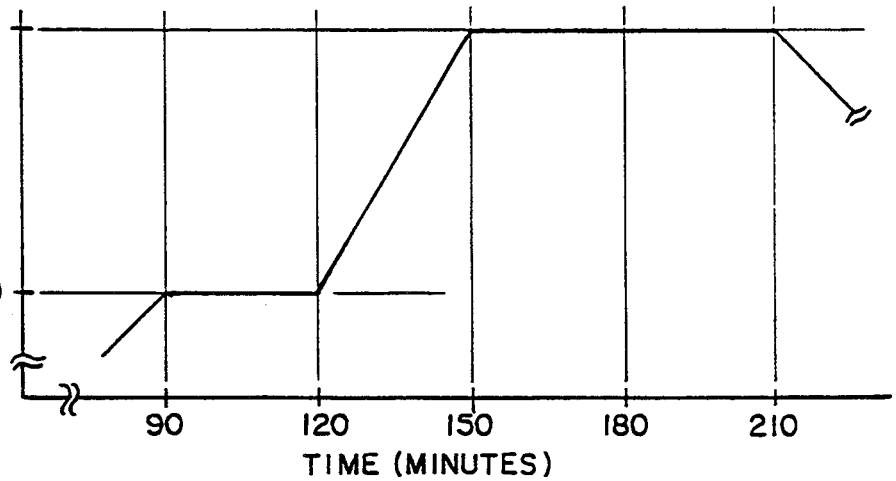

The substrate cover 28 and cover 38 each having the patterned glazed glass frit as shown in FIG. 5C is mated to surfaces 22a and 22b of substrate 22 in the following manner. The base 22 and covers 28, 38 are mated together and are held in place by a suitable jig (not shown) which exerts a force to hold said members 22, 28, and 38 together. The entire assembly including the jig is then heated in a chamber which provides a vacuum of typically from 1 torr to $10^{-6}$ torr, at a temperature above the glazing temperature of the glass frit, but below the crystallographic transformation temperature of the material of the substrates in order to cause the glass frit to reflow and wet both the quartz cover 28 and the quartz substrate or base 22 and base 22 and cover 38. A sealing temperature profile such as shown in FIG. 7 for the devitrifying frit "7572" or as shown in FIG. 8 for the vitrifying frit "8463" may be used. A maximum sealing temperature in the range of 410° C. to 470° C. for the devitrifying frit "7572" is preferably used with 430° C. being the preferred temperature, and a maximum sealing temperature in the range of 410° C. to 470° C. for the vitrifying frit "8463" is preferably used with 430° C. being the preferred temperature.

An alternative sealing cycle is to heat the SAW device quickly up to a temperature just below the sealing temperature and hold it at that temperature for about 1 hour. This allows any additional impurities to be out gassed. After the hold cycle, the SAW device is then brought up to a temperature above the sealing temperature for a short period to seal the mated substrates. The time period above the sealing temperature is minimized so as to minimize bubbling of the glass frit.

During the sealing operation, after the resonator 20' has been held at the final temperature for the prescribed period, the heat source in the chamber is turned-off and the chamber is allowed to cool to near ambient temperature before removing the resonator 20'.

At this point, the resonator 20' is provided as shown in FIGS. 2, 2A. The resonator 20' as shown in FIGS. 2, 2A includes pairs of exposed bus bars, (not numbered), base substrate 22, glass frit seals and substrate covers 28, 38. Note that the widths $W_{28}$ and $W_{38}$ of substrate covers 28, 38 are each selected to be smaller than the width $W_{22}$ of the base substrate 22, such that the bus bars are exposed on the surface of the base substrate 22.

For a device such as a delay line (not shown), the seal may be a non-rectangular pattern so that portions of the seal will not be perpendicular to the acoustic aperture of the device. With this arrangement, reflected surface waves will not interfere with the operation of the delay line.

Referring back to FIGS. 2A, 2B trim pads 27 and 37 are shown disposed on inner surfaces of covers 28 and 38. The trim pads 27, 37 are provided over covers prior to sealing of the SAW device 20'. Here, the trim pads may be used to make adjustments in the frequency characteristics of either or beth of the SAW resonators as generally described in U.S. patent application Ser. No.

944,911 filed Dec. 22, 1986 and assigned to the assignee of the present invention.

The technique described in conjunction with the above referenced U.S. patent application may be used to adjust the frequency characteristics to well within ±1 ppm.

Returning to FIG. 2A it is preferable to mount the resonator 20' on a base such as a metal base 62 of a hybrid SAW package 60. Here a double sided tape 64 is used to mount the composite resonator 20', although an RTV rubber may alternatively be used. A suitable tape is an adhesive transfer tape "Scotch Brand" No. Y-9473 by 3M Corp. St. Paul, Minn.

The bus-bars are connected in parallel by use of 3-mil thick gold bonding wires. Other arrangements may also be used.

Figure 9:
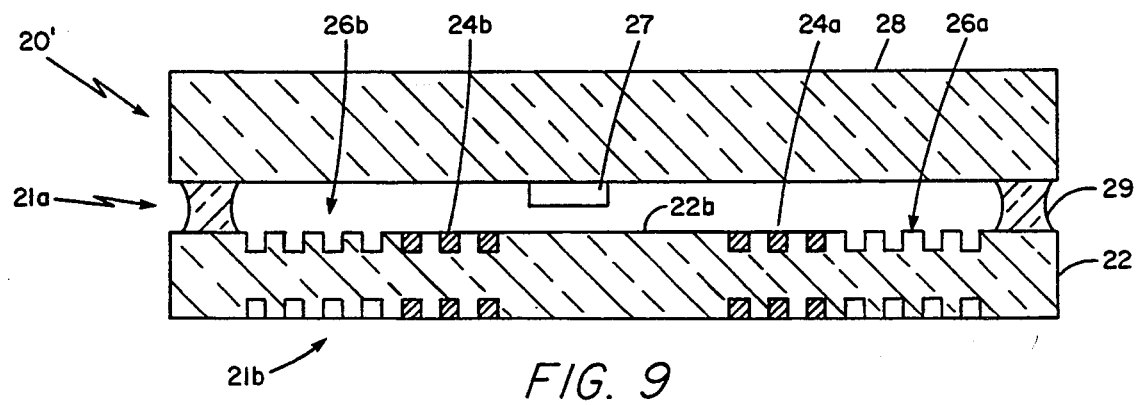
FIG. 9 is a cross-sectional view of the device of FIG. 3E having a first cover disposed over the first SAW device as generally described in conjunction with FIGS. 5A–5C.
Figure 10:
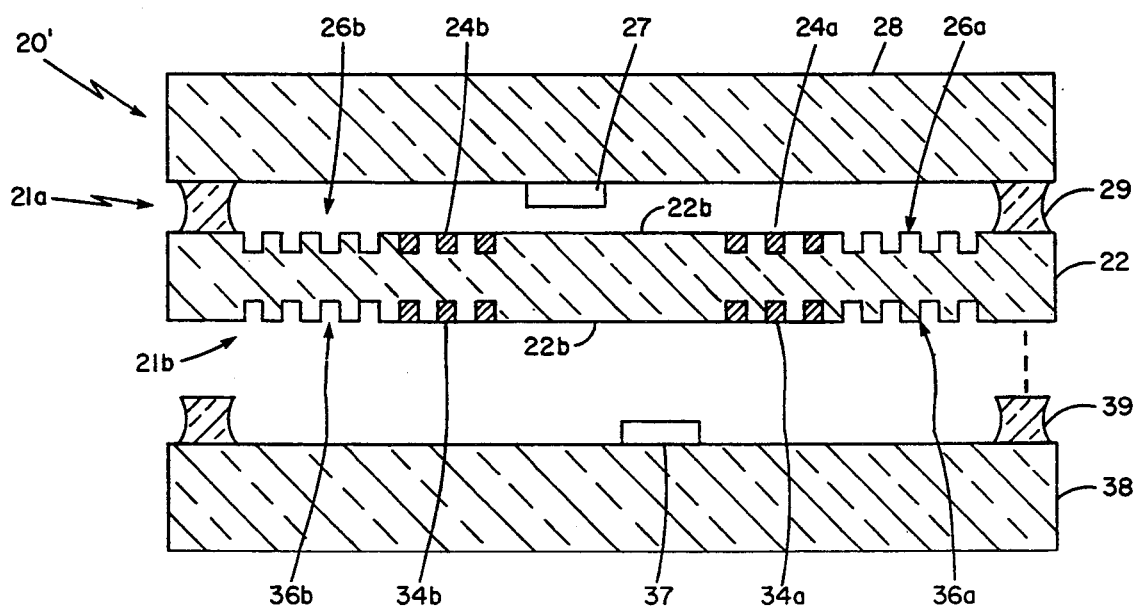
FIG. 10 is a cross-sectional view of the device of FIG. 9 having a second SAW resonator and a cover disposed to enclose the second SAW resonator to provide the device as generally shown in FIG. 2.

Other alternative arrangements for fabricating the dual resonator SAW device 20 may be used. As shown in FIGS. 9 and 10, for example, the first SAW resonator 21a may be fabricated as described in conjunction with FIGS. 3A–3F and subsequent thereto the cover may be disposed over the first surface of the SAW device (FIG. 9), as was described above in conjunction with FIGS. 5A–8. Then, the second resonator 21b may be fabricated on the second surface 22b of base 22 and subsequently the second cover may be disposed thereover as also described above (FIG. 10). Other variations in the SAW device are also possible. For example, the SAW device may have partially recessed or surface mounted transducers, as well as, other variations in reflective gratings. Further still, the SAW transducers may be provided from a conductive material which is doped with a suitable material to reduce post sealing frequency shifts as described in copending application Ser. No. 07/221,495, filed Jun. 29, 1988 now U.S. Pat. No. 5,345,135 issued Sep. 6, 1994. Furthermore, other types of devices such as SAW delay lines and filters may also use the teachings of this invention.

Having described preferred embodiments of the invention, it will now become apparent to one of skill in the art that other embodiments incorporating their concepts may be used. For example, in some applications, it might be preferable to connect the resonators 21a, 21b in series rather than parallel. It is believed that the same frequency cancellation would be provided. It is felt, therefore, that these embodiments should not be limited to disclosed embodiments, but rather should be limited only by the spirit and scope of the appended claims.

What is claimed is:

1. A surface wave device, comprising:
   means for providing first and second opposing surfaces in direct strain transfer relationship, with each surface supporting surface wave propagation; and
   transducer means for coupling to each of said pair of mechanically coupled surface wave propagation surfaces.

2. The device of claim 1 wherein said means for providing first and second surfaces is a pair of substrates disposed in direct mechanical coupling relationship such that strains induced in a first one of the pair of opposing surfaces are transferred to the second one of the pair of opposing surface with substantially equal magnitude but opposite direction.

3. The device of claim 2 wherein said transducers means includes first and second pairs of transducers coupled to respective first and second surface wave propagation surfaces.

4. The device of claim 3 wherein each of said transducer pairs include input and output transducers disposed over said first and second surfaces; and
   wherein said input transducers are electrically connected together in parallel and said output transducers are electrically connected in parallel.

5. The device of claim 4 wherein said substrate are ST or a rotated ST-cut of quartz.

6. The device of claim 1 wherein said means for providing first and second mechanical coupled opposing surfaces is a substrate having a pair of opposing surfaces.

7. The device of claim 6 wherein said transducers means includes first and second pairs of transducers coupled to respective first and second surface wave propagation surfaces.

8. The device of claim 7 wherein each of said transducer pairs include input and output transducers disposed over said first and second surfaces; and
   wherein said input transducers are electrically connected together in parallel and said output transducer pair are electrically connected in parallel.

9. The device of claim 8 wherein said substrates are ST-cut quartz or a rotated ST-cut of quartz.

10. A surface wave device, comprising:
    a substrate having a pair of opposing surfaces, each surface supporting surface wave propagation;
    transducer means for surface wave coupling to each of said surface wave propagation surfaces; and
    means for enclosing each of said surface wave propagation surfaces.

11. The device of claim 10 wherein said substrate is comprised of an ST-cut of quartz.

12. The device of claim 11 wherein said means for enclosing comprises a pair of cover members each of an ST-cut of quartz; and
    means for sealing each of said quartz covers to said base.

13. The device of claim 12 wherein said means for sealing is a glass frit.

14. The device of claim 13 wherein said transducer means includes a pair of input transducers disposed on respective ones of said opposing surfaces of said substrate and a pair of output transducers disposed on respective ones of said opposing surfaces.

15. The device of claim 14 wherein said input transducers are electrically connected a parallel and said output transducers are electrically connected in parallel.

16. The device of claim 15 wherein said input and output transducers disposed on said respective opposing surface are disposed in alignment with each other.

17. The device of claim 15 wherein said input and output transducers disposed on respective surfaces each comprise respective first and second SAW devices with each device having substantial the same frequency characteristic.

18. The device of claim 12 wherein said cover members each have a pad of material disposed over an inner surface thereof in a region of said cover aligned over a region spacing a respective pair of input and output transducers.

19. The device of claim 18 wherein at least one of said pads of material has a portion thereof disposed on said respective surface wave propagation surface between said respective pair of input and output transducers.

20. A surface wave resonator, comprising:

a base comprised of a piezoelectric crystalline material having first and second opposing surfaces, each which supports surface wave propagation;

first and second sets of reflecting gratings, each set including a pair of reflecting gratings having a plurality of grooves disposed in said base with said first set disposed on said first surface wave propagation surface, and said second set disposed on said second surface wave propagation surface;

first and second pairs of interdigitated transducers, each one of said first and second pairs of interdigitated transducers disposed over a respective one of said pair of surface wave propagation surfaces between a respective one said sets of reflecting gratings;

a pair of covers, each cover comprised of a piezoelectric crystalline material matched to the material of the base; and means for sealing said base to each of said covers disposed between peripheral surface portions of each one of said covers and said base.

21. The device of claim 20 wherein said base is comprised of an ST-cut quartz.

22. The device of claim 21 wherein said cover members are each comprised of an ST-cut of quartz.

23. The device of claim 22 wherein said means for sealing is a glass frit.

24. The device of claim 23 wherein said first and second pairs of interdigitated transducers includes a pair of input transducers disposed on respective ones of said base surfaces of said substrate and a pair of output transducers disposed on respective ones of said opposing surfaces.

25. The device of claim 24 wherein said input transducers are electrically connected a parallel and said output transducers are electrically connected in parallel.

26. The device of claim 25 wherein said input and output transducers are disposed in alignment with each other on said respective opposing surfaces.

27. The device of claim 26 wherein each of said resonators have about the same frequency characteristics.

28. The device of claim 27 wherein each cover member has a pad of material disposed over an inner surface thereof.

29. The device of claim 28 wherein at least one of said pads of material has a portion thereof disposed on said respective surface wave propagation surface.

30. A method of reducing vibration sensitivity of a SAW resonator, comprises the steps of:

providing a base having a pair of SAW resonators disposed in strain coupling relationship; and connecting said SAW resonators in parallel.

31. The method of claim 30 wherein the providing step further includes the step of:

providing a crystalline substrate having a first SAW resonator disposed on a first surface thereof, and a second SAW resonator disposed on a second, opposing surface thereof.

32. The method of claim 31 wherein said connecting step comprises the steps of:

connecting the input transducers of the first SAW resonator in parallel with the input transducers of the second SAW resonator; and connecting the output transducers of the first SAW resonator in parallel with the output transducer of the second SAW resonator.

* * * * *